United States Patent [19]

Fazan et al.

[11] Patent Number: 5,053,351
[45] Date of Patent: Oct. 1, 1991

[54] METHOD OF MAKING STACKED E-CELL CAPACITOR DRAM CELL

[75] Inventors: Pierre Fazan; Hiang C. Chan; Howard E. Rhodes; Charles H. Dennison; Yauh-Ching Liu, all of Boise, Id.

[73] Assignee: Micron Technology, Inc., Boise, Id.

[21] Appl. No.: 671,312

[22] Filed: Mar. 19, 1991

[51] Int. Cl.$^5$ ............................................. H01L 21/70
[52] U.S. Cl. ........................................ 437/52; 437/47; 437/48; 437/60; 437/233; 437/919; 357/23.6
[58] Field of Search ................. 437/47, 48, 51, 52, 437/60, 191, 193, 195, 228, 233, 235, 919; 357/23.6, 51

[56] References Cited

U.S. PATENT DOCUMENTS

| 4,742,018 | 5/1988 | Kimura et al. |
| 4,953,126 | 8/1990 | Ema ............................ 357/23.6 |
| 5,021,357 | 6/1991 | Taguchi et al. ............... 437/919 |

FOREIGN PATENT DOCUMENTS

| 0058254 | 5/1981 | Japan . |
| 0042161 | 2/1989 | Japan . |
| 0187847 | 3/1989 | Japan . |
| 0270343 | 10/1989 | Japan . |

OTHER PUBLICATIONS

"A Spread Stacked Capacitor (SCC) Cell for 64MBit DRAMS", by S. Knoue et al., pp. 31–34.
"3-Dimensional Stacked Capacitor Cell for 16M and 64M DRAMS", by T. Ema et al., pp. 592–595.

Primary Examiner—Brian E. Hearn
Assistant Examiner—Tom Thomas
Attorney, Agent, or Firm—David J. Paul

[57] ABSTRACT

An existing stacked capacitor fabrication process is modified to construct a three-dimensional stacked capacitor, referred to hereinafter as a stacked E cell or SEC. The SEC design defines a capacitor storage cell that in the present invention is used in a DRAM process. The SEC is made up of a polysilicon storage node structure having an E-shaped cross-sectional upper portion and a lower portion making contact to an active area via a buried contact. The polysilicon storage node structure is overlaid by polysilicon with a dielectric sandwiched in between to form a completed SEC capacitor. With the 3-dimensional shape and a texturized surface of a polysilicon storage node plate, substantial capacitor plate surface area of 3 to 5X is gained at the storage node.

18 Claims, 11 Drawing Sheets

METHOD OF MAKING STACKED E-CELL CAPACITOR DRAM CELL

FIELD OF THE INVENTION

This invention relates to semiconductor circuit memory storage devices and more particularly to a process for fabricating three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of a "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by S. Inoue et al., entitled "A SPREAD STACKED CAPACITOR (SSC) CELL FOR 64 MBIT DRAMS," IEDM, Dig. Tech. Papers, pp. 31-34, 1989, herein incorporated by reference, discusses a storage electrode of a 1st memory cell being expanded to the neighboring 2nd memory cell area. The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell. However, the SSC process is complicated and adds at least two masks to the standard process.

Also, a paper submitted by T. Ema et al., entitled "3-DIMENSIONAL STACKED CAPACITOR CELL FOR 16 M AND 64 M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

The present invention develops a stacked E cell similar to the fin cell with a major and very important difference. The stacked E cell maximizes the area available for the storage node that the fin cell uses up for the contact made to connect the storage node plate to an active area. An existing stacked capacitor fabrication process is modified to construct a three-dimensional stacked E cell.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked capacitor, referred to hereinafter as a stacked E cell or SEC. The SEC design defines a capacitor storage cell that in the present invention is used in a DRAM process, however it will be evident to one skilled in the art to incorporate these steps into other processes requiring memory cells such as VRAMs, EPROMs or the like.

After a silicon wafer is prepared using conventional process steps, the present invention develops the SEC by depositing alternating layers of polysilicon and dielectric which are then patterned and etched to form a storage node plate having an E-shaped cross-section. The entire structure conforms to the wafer's topology formed by two adjacent digit lines running perpendicular to and over the top of two adjacent word lines, thus resulting in increased capacitor plate surface area for each storage cell. Such a structure is a vast improvement over the fin cell by maximizing the area available for a storage node.

DETAILED DESCRIPTION OF THE PREFERRED EMBODIMENT

The invention is directed to maximizing storage cell surface area in a high density/high volume DRAM fabrication process, in a sequence shown in FIGS. 1-10.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide. The active areas can be arranged in interdigitated columns and non-interdigitated rows or simply parallel and in line to one another in both the vertical and horizontal directions. The active areas are used to form active MOS transistors that can be doped as NMOS or PMOS type FETs depending on the desired use.

Figure 1:
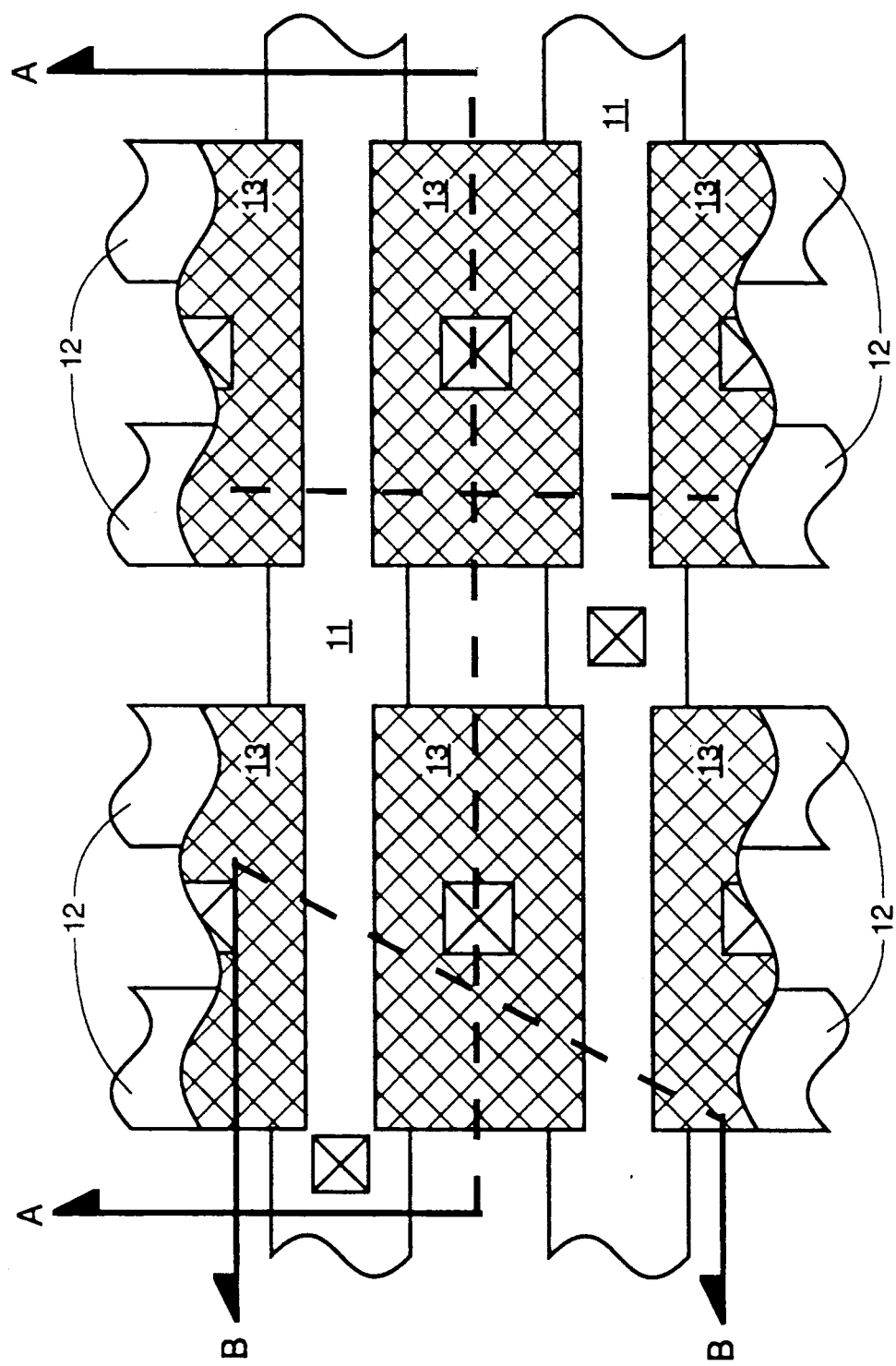
FIG. 1 is a top planar view of a portion of an in-process wafer showing digit lines, word lines and storage capacitors.

FIG. 1 shows a top planar view portion of a completed multilayered memory array with the main building blocks comprising digit lines 11, word lines 12 and storage node plates 13 of an SEC.

Figure 2:
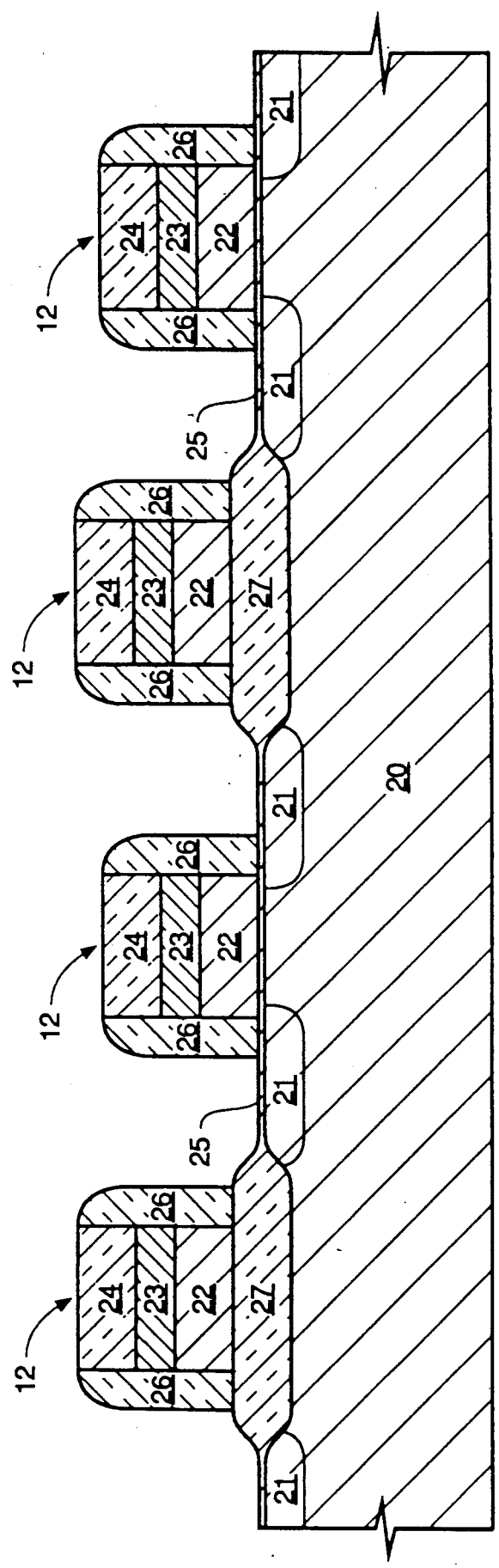
FIG. 2 is a cross-sectional view through broken line A—A of FIG. 1.

As shown in FIG. 2, poly 22, covered with silicide 23 and dielectric 24 (either oxide or nitride) are patterned to serve as word lines 12. Word lines 12 are further isolated from one another as well as subsequent conductive layers by dielectric spacers 26 (also either oxide or nitride) that have been previously deposited over a thin layer of gate oxide 25 or a thick layer of field oxide 27. Dielectrics 24 and 26 may be deposited by chemical vapor deposition (CVD) which is preferred for its excellent conformity. Active areas 21 have been appropriately doped to a desired conductivity type which penetrates into the bulk silicon wafer 20, by conventional process steps. Now the wafer is ready for digit line formation that will run perpendicular to word lines 12.

Figure 3:
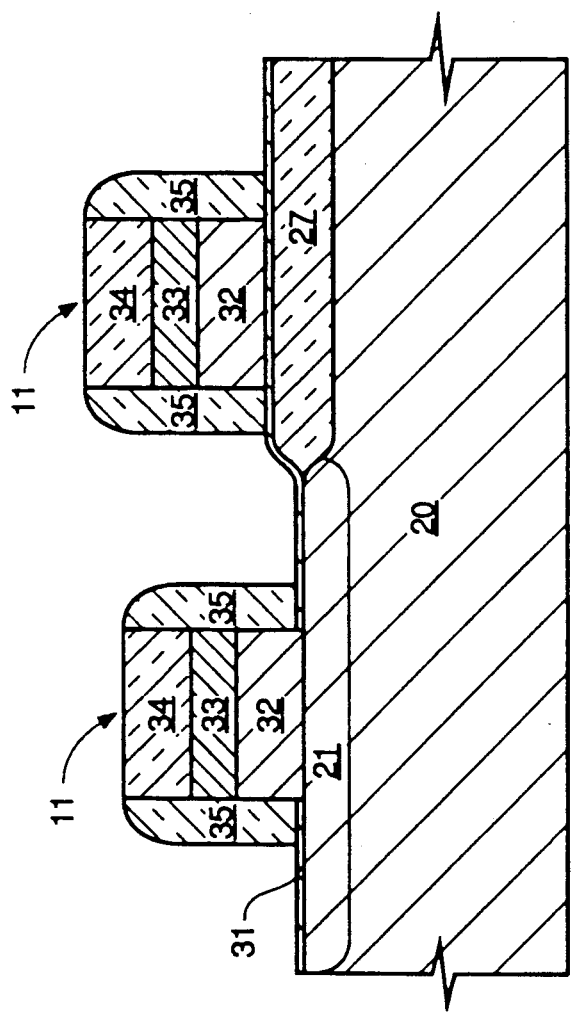
FIG. 3 is a cross-sectional view through broken line B—B of FIG. 1.

FIG. 3 shows the formation of digit lines 11. A conformal layer of dielectric 31 is deposited over the existing wafer surface to isolate previously formed active areas 21 from the subsequent formation of digit lines 11. First, buried digit line contacts are patterned and etched through dielectric 31 allowing access to active areas 21. Second, digit lines 11 are made up of patterned layers consisting of polysilicon 32, silicide 33 and dielectric 34 following the location of the buried digit line contacts. Dielectric 34 can be either nitride or oxide and may be deposited by chemical vapor deposition (CVD). Polysilicon 32 has previously been conductively doped to electrically couple with silicide 33 to serve as the conductor for digit lines 11. Digit lines 11 run perpendicular to and over the top of word lines 12 (shown in FIG. 2) and conform to the wafer surface resulting in a waveform-like topology running in both the digit line and word line directions. A second dielectric, such as nitride or oxide is now deposited (preferably by CVD), followed by an anisotropic etch to form vertical dielectric spacers 35.

FIGS. 4-10 show the formation of the SEC seen from the cross-sectional view A—A of FIG. 1, which shows a cross-section of parallel word lines 12 that presents clearer views of the present invention. Therefore, the invention will be described from here on as seen from the word line cross-section A—A.

Figure 4:
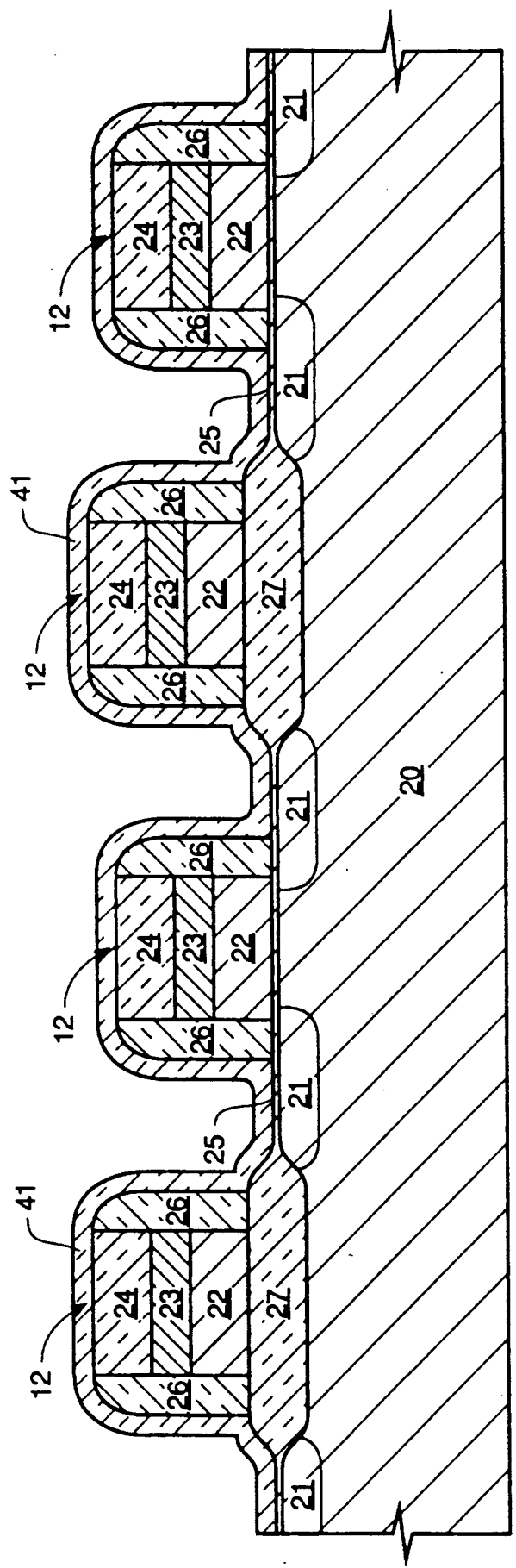
FIG. 4 is a cross-sectional view of the in-process wafer portion of FIG. 2 following a conformal dielectric deposition over existing word lines.

As shown in FIG. 4, word lines 12 and their subsequent isolation layers are then covered with dielectric 41 to a preferred thickness of 500 to 2000 angstroms preferably by CVD. Dielectric 41 may be either nitride or oxide depending on a desired storage node etch used later in the process.

Figure 5:
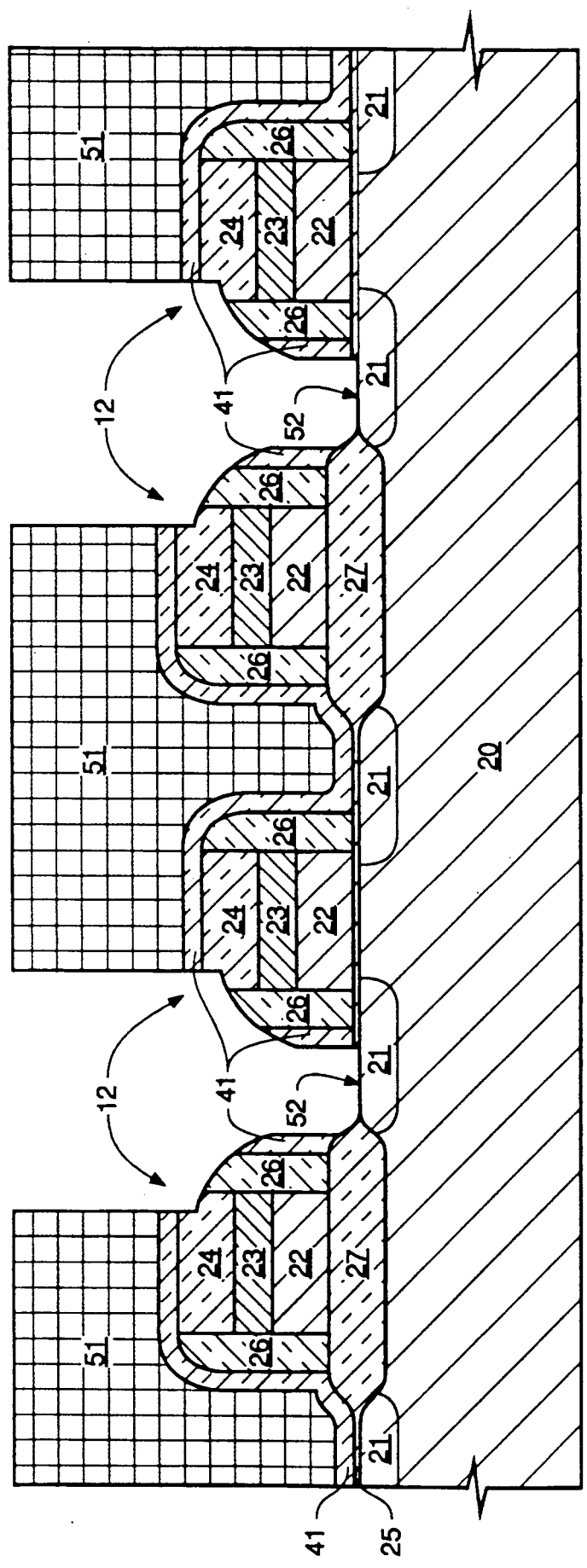
FIG. 5 is a cross-sectional view of the in-process wafer portion of FIG. 4 following a buried contact photo and etch.

As shown in FIG. 5, buried contact 52 is aligned to word lines 12 by covering all of the wafer surface area with photoresist 51. After applying an appropriate photomask, a buried contact anisotropic etch provides an opening to locate contact 52.

Up to this point, process flow has followed that of an array comprising conventional stacked capacitor cells. From this point forward, the process is unique to an array having SEC-type storage capacitors.

Figure 6:
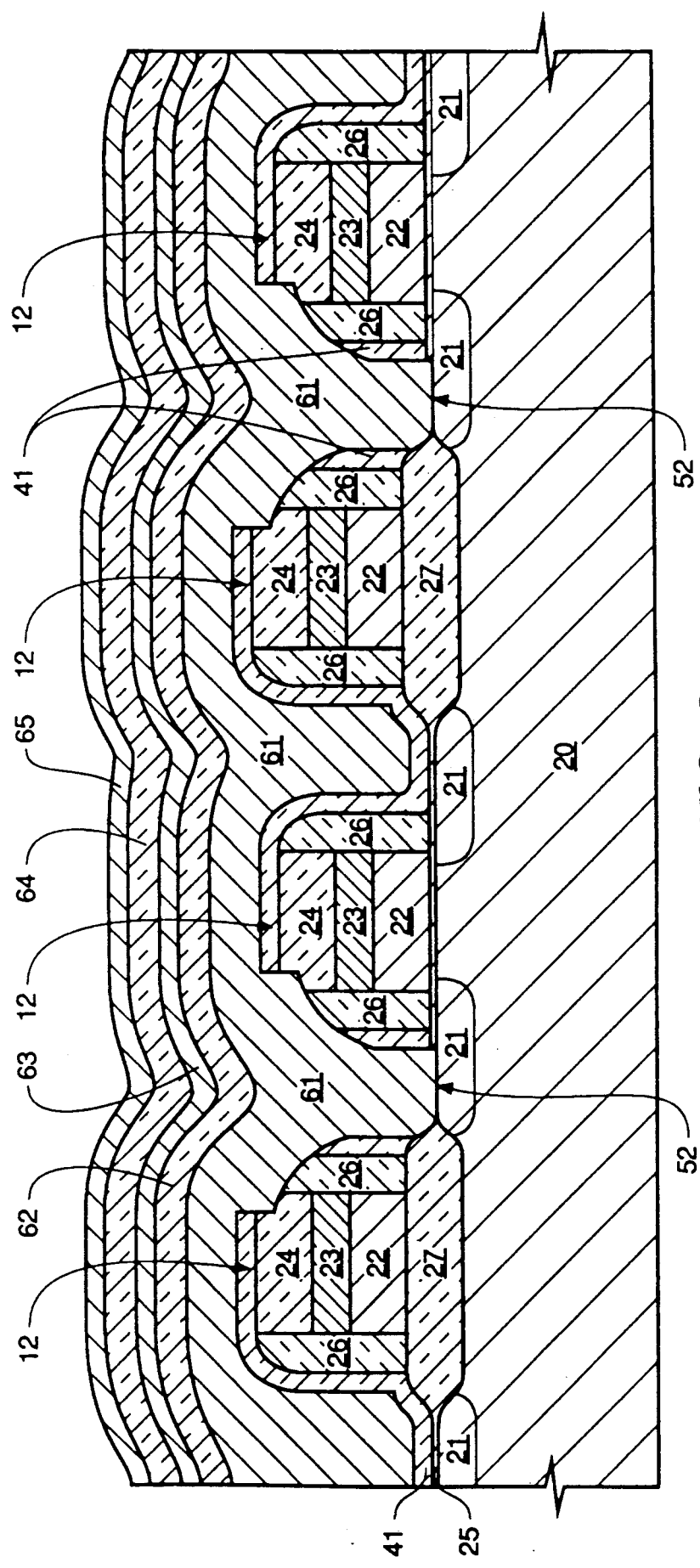
FIG. 6 is a cross-sectional view of the in-process wafer portion of FIG. 5 following a photoresist strip, a blanket deposition of a thick polysilicon layer and blanket depositions of alternate layers of dielectric and polysilicon.

As shown in FIG. 6, the photoresist 51 (of FIG. 5) has been stripped and a thick layer of conformal polysilicon 61 is deposited. Conformal poly layer 61 connects to active area 21 via buried contact 52. Following poly 61 deposition, dielectric layers 62 and 64 and polysilicon layers 63 and 65 are deposited alternately on top of one another with dielectric 62 being the first layer deposited superjacent thick polysilicon 61. The selection of dielectric layers 62 and 64 can be either oxide or nitride depending on the type of dielectric deposited for dielectric layer 41 along with the storage node etch used later in the process. The combinations selected for dielectrics 41, 62 and 64 will become obvious to one skilled in the art once the procedures for the storage node etch is developed later in this embodiment.

Figure 7:
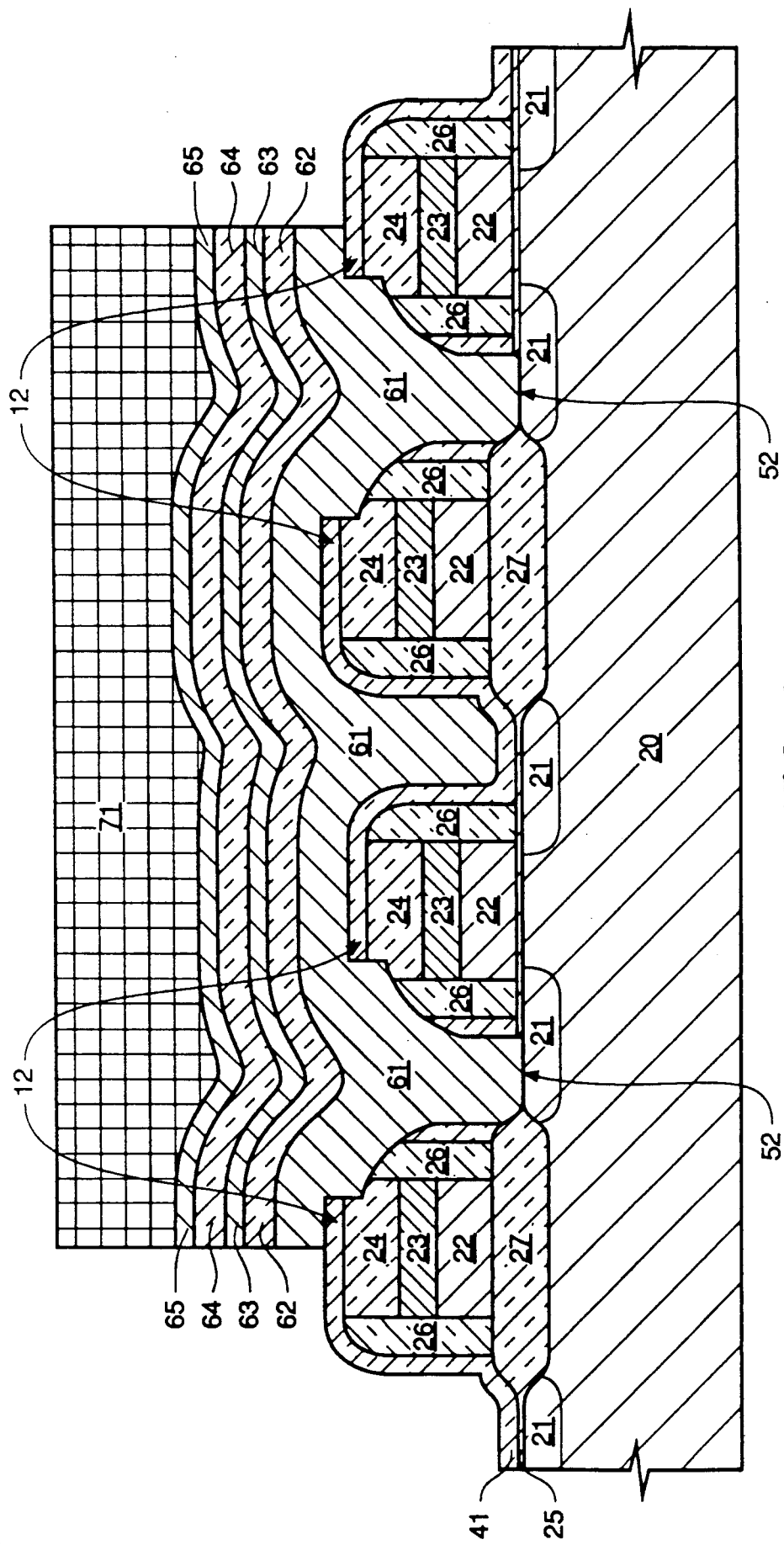
FIG. 7 is a cross-sectional view of the in-process wafer portion of FIG. 6, following photo and etch of two adjacent storage nodes.

As shown in FIG. 7, photoresist 71 is patterned so a subsequent etch will form a storage node area containing a storage node pair that will later be patterned and etched to form two separate storage node plates.

Figure 8:
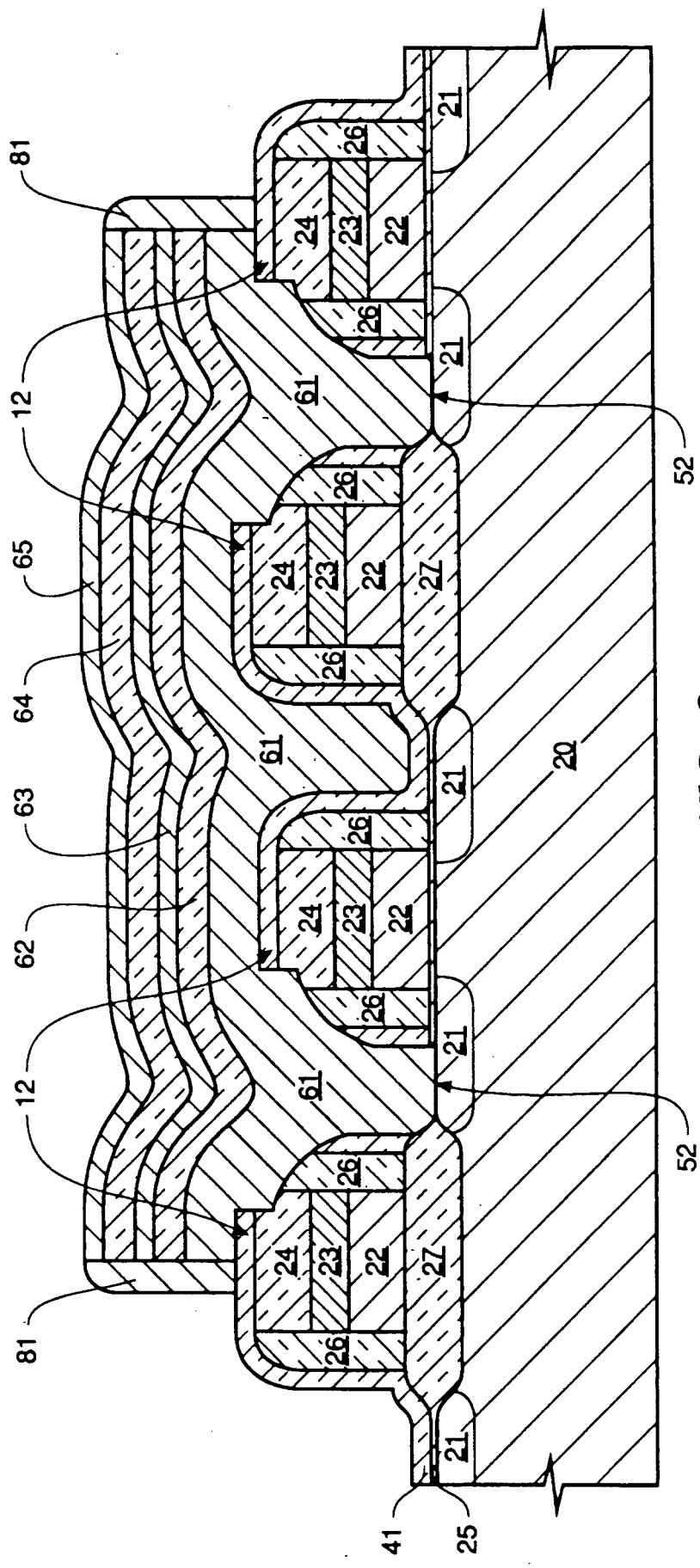
FIG. 8 is a cross-sectional view of the in-process wafer portion of FIG. 7, after a polysilicon deposition followed by a poly spacer etch.

As shown in FIG. 8, after photoresist 71 (seen in FIG. 7) is stripped, a conformal layer of poly is deposited, followed by an anisotropic etch to form vertical poly spacers 81 attaching poly layers 61, 63 and 65 together on opposite ends of the patterned storage node area.

Figure 9A:
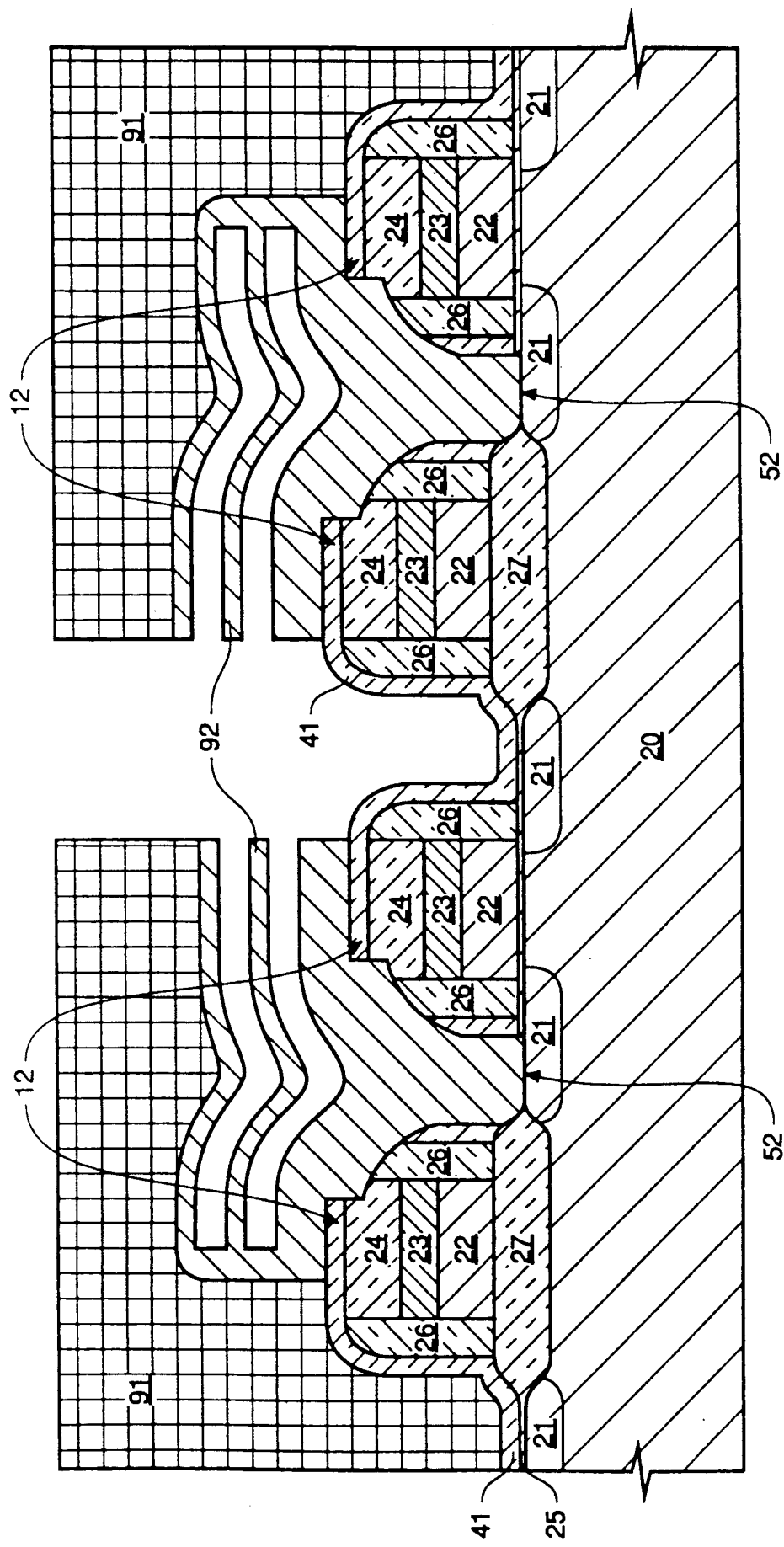
FIG. 9a is a cross-sectional view of the in-process wafer portion of FIG. 8, following a photo and etch of adjacent storage node plates.

As shown in FIG. 9a, photoresist 91 is patterned to form separate poly storage node plates 92 (made up of patterned poly layers 61, 63, 65 and 81 as seen in FIG. 8). During the patterning of storage node plates 92, an etch is performed that will consume the poly layers making up plates 92 along with dielectric layers 62 and 64 and then stopping on dielectric layer 41. For example, the selection of dielectric 41 is nitride therefore requiring dielectrics 62 and 64 to be of a second type dielectric such as oxide. Following the patterning of storage node plates 92 an isotropic etch is performed to remove oxide dielectrics 62 and 64 (seen in FIG. 8). As the example suggests, the selection of dielectrics 41, 62 and 64 may change as long as dielectric 41 is of a different type than that of dielectrics 62 and 64. The overall result of these two etches form the upper E-shaped cross-sectional portion and the lower portion of the SEC that extends downward and couples to active area 21 via buried contact 52. Poly plates 92 can be texturized by conventional texturization techniques to further increase the storage node plate's surface area.

Figure 9B:
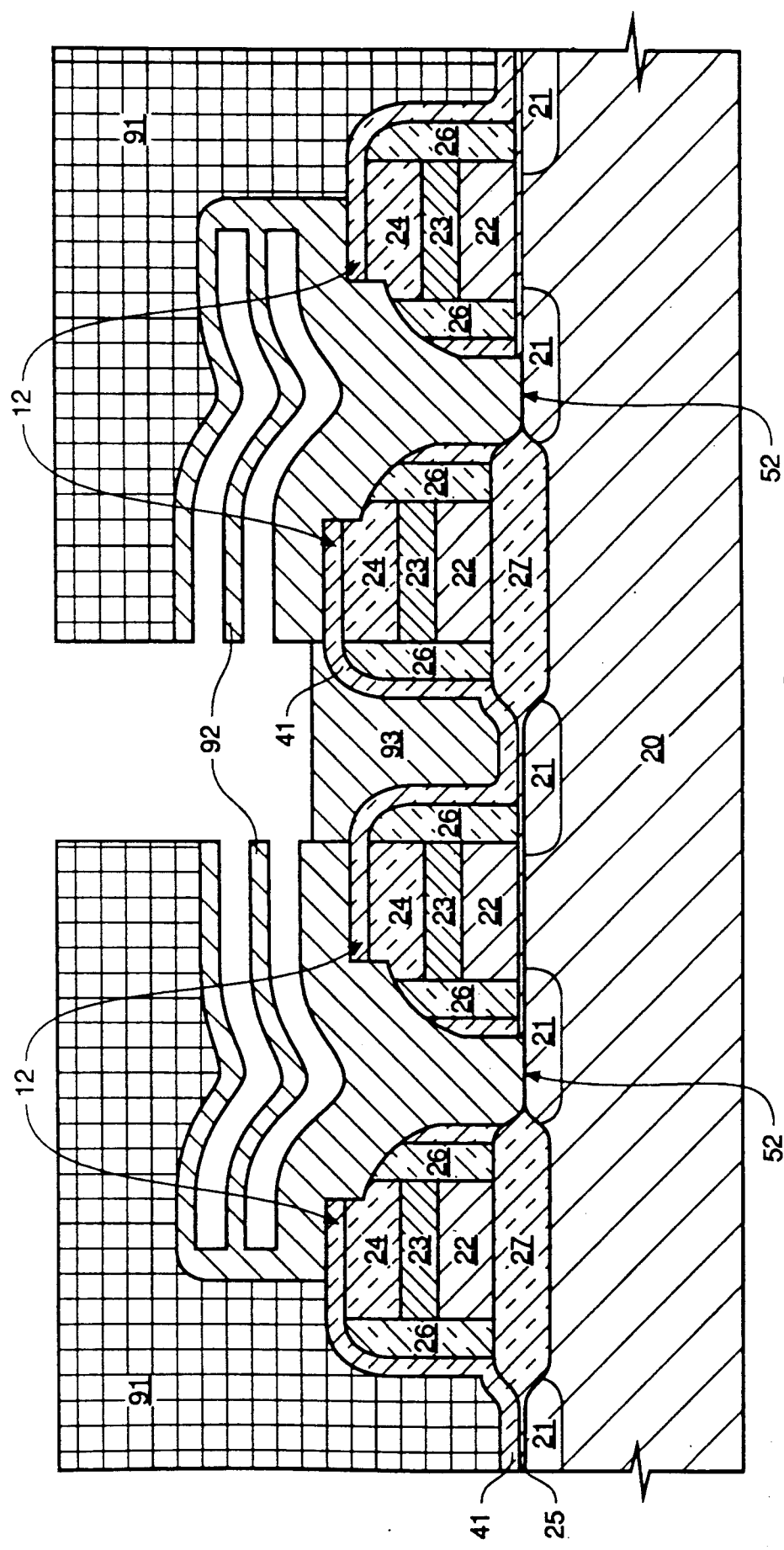
FIG. 9b is a cross-sectional view of the in-process wafer portion of FIG. 8, following a photo and partial poly etch of adjacent storage node plates.

Alternately, as shown in FIG. 9b, a partial poly etch leaves a remaining poly portion 93 still allowing physical connection between adjacent storage node plates 92. An isotropic wet etch is preformed to remove dielectrics 62 and 64 (seen in FIG. 8). When using this etch, dielectrics 41, 62 and 64 may be of the same type (oxide or nitride) as partial poly etch allows the remaining poly portion 93 to protect dielectric 41 during the removal of dielectrics 62 and 64. The result of these two etches form the E-shaped cross-sectional portion of the SEC. Following the isotropic wet etch poly 93 is completely removed by a poly etch that stops upon reaching dielectric 41 to form the lower portion of the SEC that connects to active area 21 via buried contact 52 thereby completing the storage node plate 92.

Figure 10:
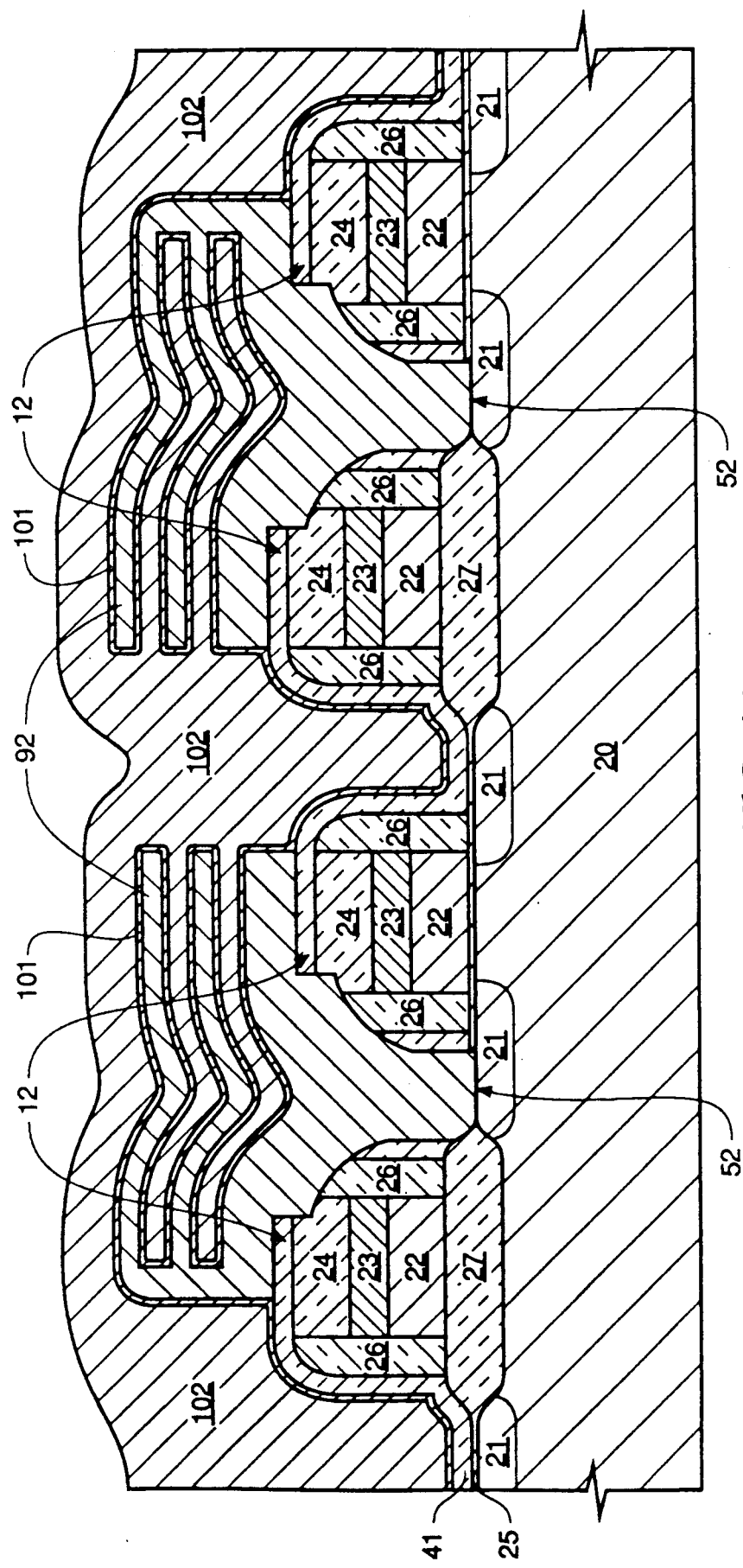
FIG. 10 is a cross-sectional view of the in-process wafer portion of FIGS. 9a or 9b, following depositions of conformal cell dielectric and a poly cell plate.

As shown in FIG. 10, following a photoresist 91 strip (seen in FIG. 9a or 9b), dielectric 101 is deposited (preferably by CVD) that conforms to poly storage node plates 92. Dielectric 101 can be from materials having a high dielectric constant such as nitride, an oxide-nitride compound or $Ta_2O_5$. Dielectric 101 serves as a cell dielectric for the SEC. Following cell dielectric 101 deposition, a blanket deposition of conformal poly 102 is deposited. Poly plates 92 and poly 102 are conductively doped either n-type or p-type depending on the conductivity type desired for active area 21. Poly 102 now serves as a poly capacitor cell plate which becomes a common cell plate to all SEC storage capacitors in the array.

With the 3-dimensional shape and texturized surface of poly storage node plate 92, along with poly capacitor cell plate 102 that envelops plate 92, substantial capacitor plate surface area is gained at the storage node. Because capacitance is greatly affected by surface area of a capacitor's storage node plates, the area gained can provide an additional 3 to 5X increase in capacitance over that of a conventional STC capacitor, without more space than that required for defining a stacked capacitor storage cell.

Throughout the preferred embodiment, polysilicon is deposited and conductively doped to serve as conductive lines and capacitor plates, however many materials that possess conductive qualities and that can be deposited or sputtered may be used in place of polysilicon if so desired. It is therefore, to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said array;

depositing a first dielectric layer superjacent said first conductive layer;

masking and etching said first conductive and said first dielectric layers to form a plurality of parallel conductive word lines aligned along said rows such that each said word line passes over a inner portion of each said active area being separated therefrom by a remanent of said gate dielectric layer;

creating of a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent to said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing a fourth dielectric layer on surface of said silicon, said fourth dielectric conforming to said waveform-like topology;

masking and etching a second aligned buried contact location allowing access to a storage node junction;

depositing a third conductive layer superjacent existing topology, said conductive layer making contact at said storage node junction;

depositing a fifth dielectric layer superjacent said third conductive layer;

depositing a fourth conductive layer superjacent said fifth dielectric layer;

depositing a sixth dielectric layer superjacent said fourth conductive layer;

depositing a fifth conductive layer superjacent said sixth dielectric layer;

masking and etching said third, fourth and fifth conductive layers and said fifth and sixth dielectric layers to form a pair of storage nodes connected to one another;

depositing and anisotropically etching a conformal sixth conductive layer to form vertical conductive spacers, said spacers making contact to vertical patterned edges of said third, fourth and fifth conductive layers;

masking and etching said connected storage node pair thereby separating said storage node pair into separate storage node plates, upper portion of each said storage node plate having an E-shaped cross-section and a lower portion connecting to said storage node junction;

depositing a cell dielectric layer superjacent and coextensive said storage node plates; and depositing a seventh conductive layer superjacent and coextensive said cell dielectric layer, thereby forming a top cell plate, said top cell plate being common to the entire memory array.

2. A process as recited in claim 1, wherein said gate dielectric layer is oxide.

3. A process as recited in claim 1, wherein said first and said second conductive layers comprise a layer of tungsten silicide and a layer of conductively-doped polysilicon.

4. A process as recited in claim 1, wherein said first, said second, said third, said fourth, said fifth and said sixth dielectric layers are selected from the group consisting essentially of oxide or nitride.

5. A process as recited in claim 1, wherein said third, said fourth, said fifth, said sixth and said seventh conductive layers are conductively-doped polysilicon.

6. A process as recited in claim 5, wherein said conductively-doped polysilicon has a texturized surface.

7. A process as recited in claim 1, wherein said masking and etching of said storage node pair comprises the steps of:
 a) patterning a photoresist over said storage node pair;
 b) etching area exposed by said patterning of the photoresist thereby separating said storage node pair into single storage node plates, each said single plate having an E-shaped cross-section;
 c) etching said fifth and said sixth dielectric layers; and
 d) removing said photoresist.

8. A process as recited in claim 1, wherein said masking and etching of said storage node pair comprises the steps of:
 a) patterning a photoresist over said storage node pair;
 b) partial etching area exposed by said patterning of the photoresist thereby forming two separate E-shaped cross-sections from said storage node pair, said partial etching leaves a portion of said sixth polysilicon layer intact thereby covering said word lines;
 c) etching said fifth and said sixth dielectric layers;
 d) etching remaining said portion of sixth polysilicon layer thereby separating said storage node pair into single storage node plates, each said single plate having an E-shaped cross-section;
 e) removing said photoresist.

9. A process as recited in claim 1, wherein said first, said second, said third dielectric layers and said cell dielectric layer are deposited by chemical vapor deposition.

10. A process as recited in claim 1, wherein said cell dielectric layer is selected from the group consisting essentially of oxide, an oxide-nitride compound, or $Ta_2O_5$.

11. A process for fabricating a DRAM storage capacitor on a silicon substrate having active areas word lines and digit lines, said process comprising the following sequence of steps:
 depositing a first dielectric layer on surface of said silicon, said first dielectric layer conforming to said waveform-like topology;
 masking and etching a first aligned buried contact location allowing access to a storage node junction in each said active area;

depositing a first conductive layer superjacent existing topology, said conductive layer making contact at said storage node junction;

depositing a second dielectric layer superjacent said first conductive layer;

depositing a second conductive layer superjacent said second dielectric layer;

depositing a third dielectric layer superjacent said second conductive layer;

depositing a third conductive layer superjacent said third dielectric layer;

masking and etching said first, second and third conductive layers and said second and third dielectric layers to form a pair of storage nodes connected to one another;

depositing and anisotropically etching a conformal fourth conductive layer to form vertical conductive spacers, said spacers making contact to vertical patterned edges of said first, second and third conductive layers;

masking and etching said connected storage node pair thereby separating said storage node pair into separate storage node plates, upper portion of each said separate storage node plate having an E-shaped cross-section and lower portion connecting to said storage node junction;

depositing a cell dielectric layer superjacent and coextensive said storage node plate; and depositing a fifth conductive layer superjacent and coextensive said cell dielectric layer, thereby forming a top cell plate, said top cell plate being common to the entire memory array.

12. A process as recited in claim 11, wherein said first, said second and said third dielectric layers are selected from the group consisting essentially of oxide or nitride.

13. A process as recited in claim 11, wherein said first, second, third, fourth, and fifth conductive layers are conductively-doped polysilicon.

14. A process as recited in claim 13, wherein said conductively-doped polysilicon has a texturized surface.

15. A process as recited in claim 11, wherein said masking and etching of said storage node pair comprises the steps of:
 a) patterning a photoresist over said storage node pair;
 b) etching area exposed by said patterning of the photoresist thereby separating said storage node pair into single storage node plates, each said single plate having an E-shaped cross-section;
 c) etching said second and said third dielectric layers; and
 d) removing said photoresist.

16. A process as recited in claim 11, wherein said masking and etching of said storage node pair comprises the steps of:
 a) patterning a photoresist over said storage node pair;
 b) partial etching area exposed by said patterning of the photoresist thereby forming two separate E-shaped cross-sections from said storage node pair, said partial etching leaves a portion of said sixth polysilicon layer intact thereby covering said word lines;
 c) etching said second and said third dielectric layers;
 d) etching remaining said portion of sixth polysilicon layer thereby separating said storage node pair into single storage node plates, each said single plate having an E-shaped cross-section:

e) removing said photoresist.

17. A process as recited in claim 11, wherein said first dielectric layer and said cell dielectric layer are deposited by chemical vapor deposition.

18. A process as recited in claim 11, wherein said cell dielectric layer is selected from the group consisting essentially of oxide, an oxide-nitride compound, or $Ta_2O_5$.

* * * * *

UNITED STATES PATENT AND TRADEMARK OFFICE
CERTIFICATE OF CORRECTION

PATENT NO. : 5,053,351
DATED : October 1, 1991
INVENTOR(S) : Pierre C. Fazan, et al It is certified that error appears in the above-indentified patent and that said Letters Patent is hereby corrected as shown below:

Column 6, lines 2-2, please delete "arranged in parallel interdigitated rows and parallel non-intergitated columns".

Signed and Sealed this

Twenty-first Day of June, 1994

Attest:

BRUCE LEHMAN

Attesting Officer

Commissioner of Patents and Trademarks